(12) United States Patent
Opris

(10) Patent No.: US 7,760,012 B1
(45) Date of Patent: Jul. 20, 2010

(54) HIGH LINEARITY GMC FILTER

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 16 days.

(21) Appl. No.: 12/313,603

(22) Filed: Nov. 20, 2008

(51) Int. Cl.
*H03K 5/00* (2006.01)
(52) U.S. Cl. ...................... 327/552; 327/337
(58) Field of Classification Search ......... 327/551–559, 327/336–337
See application file for complete search history.

(56) References Cited

U.S. PATENT DOCUMENTS

| | | | | |
|---|---|---|---|---|
| 5,001,441 A | * | 3/1991 | Gen-Kuong | 330/294 |
| 5,982,214 A | * | 11/1999 | Kim | 327/280 |
| 6,314,444 B1 | * | 11/2001 | Minuhin et al. | 708/819 |
| 6,407,875 B1 | * | 6/2002 | Pierson | 360/46 |
| 6,930,544 B2 | * | 8/2005 | Yokoyama | 327/552 |

* cited by examiner

*Primary Examiner*—Dinh T. Le
(74) *Attorney, Agent, or Firm*—Carr & Ferrell LLP

(57) ABSTRACT

A second order analog filter based on transconductance amplifiers and capacitors (gmC) has good linearity at low operating voltage by using linear active transconductance amplifiers with gains determined by physical resistors and output current mirrors in a positive feedback configuration to allow the implementation of complex poles in the transfer function.

15 Claims, 10 Drawing Sheets

US 7,760,012 B1

HIGH LINEARITY GMC FILTER

TECHNICAL FIELD

The invention relates generally to electronic signal processing, and more particularly, to analog filters.

BACKGROUND

Analog filters play a very important role in communication systems and, more generally, in any analog signal processing system. Since any realizable filter transfer function can be decomposed in a factor of second order sections and first order sections, a very important building block is a second order filter that permits the implementation of complex filter poles. The emphasis in filter design is to implement such second order transfer functions with minimal power dissipation, at low supply voltage, while still maintaining tuning capability and a certain required linearity. In particular, gmC filters, which are based on transconductance amplifiers (gm) working on capacitive loads (C), have very good characteristics at high signal frequencies and are widely used in RF communication systems.

One exemplary second order filter implementation is shown in FIG. 1. An equivalent circuit targeting low voltage supply applications is further shown in FIG. 2. In the above circuit diagrams, the high efficiency comes from the use of a simple MOS device as a transconductance element. Very good high frequency performance is achieved by the lack of intermediate nodes with associated parasitic poles.

An analysis of the equivalent small signal circuit illustrated in FIG. 3 indicates a second order transfer function, if $gm_1=gm_2=gm_3$, $$\frac{V_{out}}{V_{in}} = \frac{1}{1 + \frac{sC_1}{g_m} + \frac{s^2 C_1 C_2}{g_m^2}} \quad (1)$$

where: $M_{201}$, $M_{202}$, $M_{203}$, and $M_{204}$ are assumed matched and having a common transconductance value gm;

$C_1 = C_{221}/2$;

$C_2 = C_{222}/2$.

Depending on the relative values of $C_1$ and $C_2$, the second order transfer function in Equation (1) may have a real pole or complex conjugate poles. This choice is made possible by the positive feedback of devices $M_{211}$ and $M_{212}$.

The circuits in FIG. 1 and FIG. 2 appear to have two main drawbacks, which the present invention tries to address in detail in several embodiments described below. First, the transfer characteristic and the pole location depend on the transconductance of simple MOS devices. This transconductance value is hard to control over process and especially over temperature. For the circuit in FIG. 2, it is especially difficult to ensure that $M_{211}$ and $M_{212}$ devices have the same transconductance as the $M_{201}$ and $M_{202}$ devices. If the transconductance values do not match, the circuit may latch up due to positive feedback at low frequencies. On the other hand, if the $M_{211}$ and $M_{212}$ have a transconductance intentionally lower than $M_{201}$ and $M_{202}$ transconductance, the complex poles are harder to achieve and control.

A second drawback appears to be that the signal linear range is limited by the gate-to-source overdrive. The transconductance is highly non-linear due to the simple MOS devices used and the input and output signals occur directly across the gate to source pins of these MOS devices. If the bias currents are used to adjust the transconductance values over process corner variations (for pole location tuning), this has a compounding effect on limiting the signal linear range. A process fast corner, for example, requires less bias current for a given required transconductance, which means even less gate-to-source overdrive voltage and equivalent reduced linear range. On the slow process corner, the higher bias current required and related larger voltage drops may be limited by power supply level.

It is desirable, therefore, to provide an efficient second order gmC filter implementation without the aforementioned drawbacks.

SUMMARY

In accordance with one embodiment of the present invention, a second order analog gmC filter is implemented with two transconductance amplifiers, with one of these transconductance amplifiers having a matched dual current output, one of which is used in a positive feedback configuration to allow an effective implementation of complex poles. Very good linearity may be achieved by using linear active transconductance amplifiers, where the respective transconductance value is determined by matched physical resistors. The transconductance value and pole location are independent from the individual MOS device characteristics and bias currents, and the linear range is dependent only on the physical resistor value used and the bias currents. Thus, the pole location/filter frequency corner and the linear range are decoupled and may be chosen and adjusted independently.

In an alternate embodiment of the present invention, a second order analog gmC filter may implement transmission zeros in the transfer characteristic to allow the implementation of Chebyshev type II or elliptic filters.

In yet another embodiment of the present invention, the MOS devices used in the linear transconductance amplifiers can be cascoded to improve output impedance and overall linearity.

These and other features of the present invention will be apparent from consideration of the following detailed description of the invention and the accompanying drawings.

DETAILED DESCRIPTION

Figure 1:
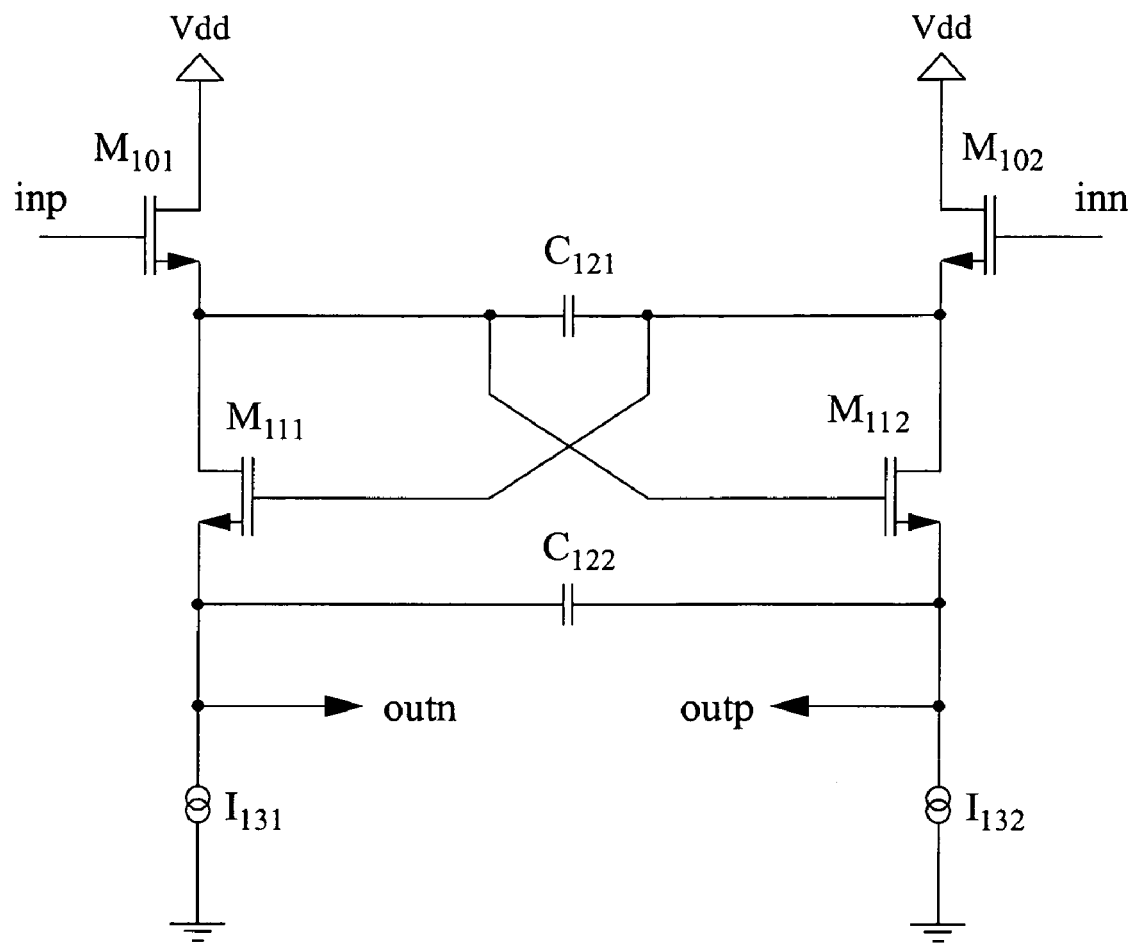
FIG. 1 is a schematic diagram of a conventional second order gmC filter. (Prior Art)
Figure 2:
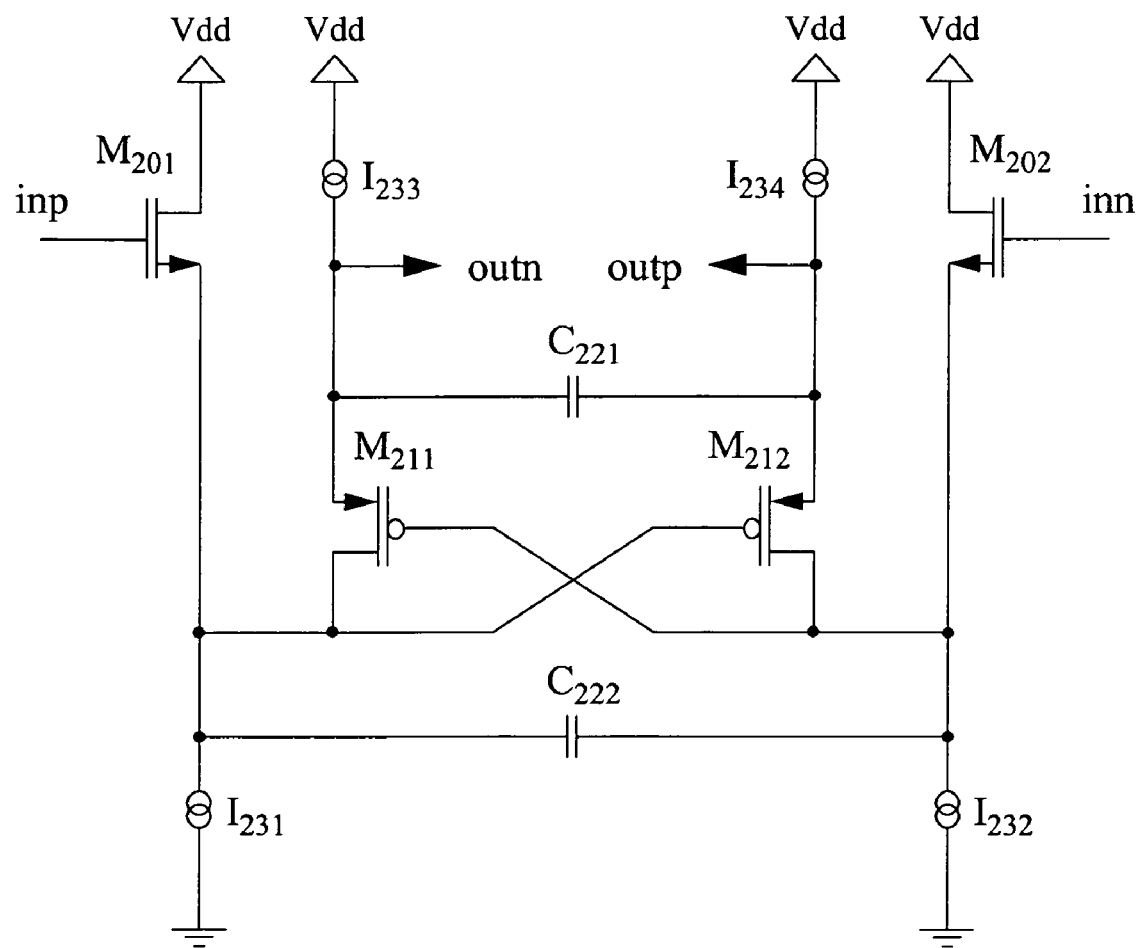
FIG. 2 is a schematic diagram of a conventional second order gmC filter suitable for low voltage applications. (Prior Art)
Figure 3:
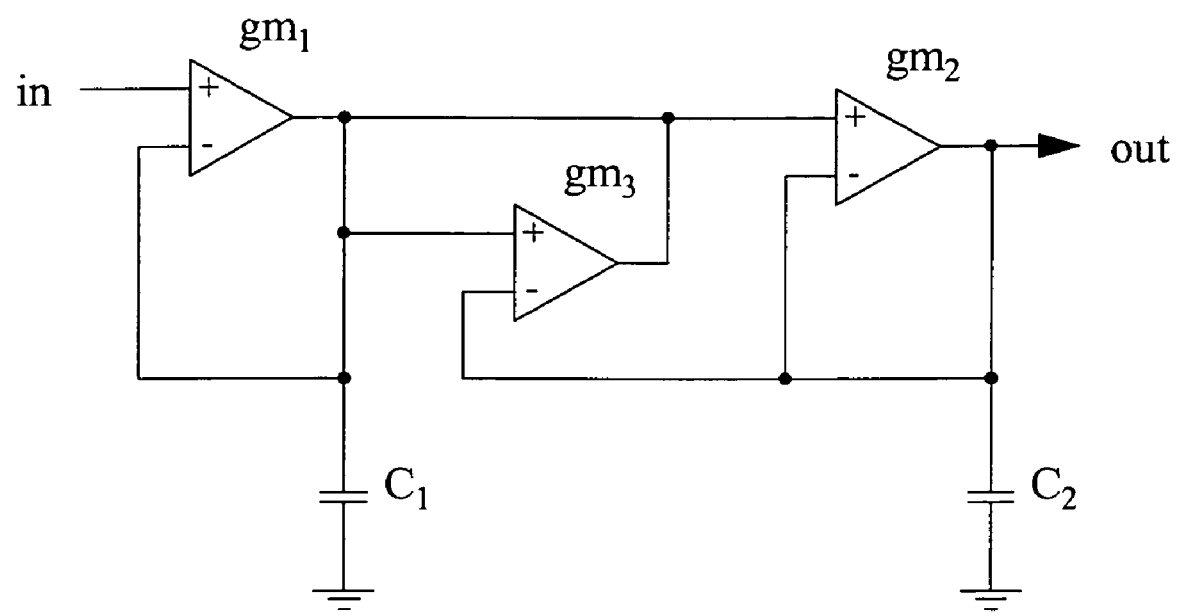
FIG. 3 is a schematic diagram illustrating the small signal equivalent diagram of the circuits shown in FIG. 1 and FIG. 2. (Prior Art)
Figure 4:
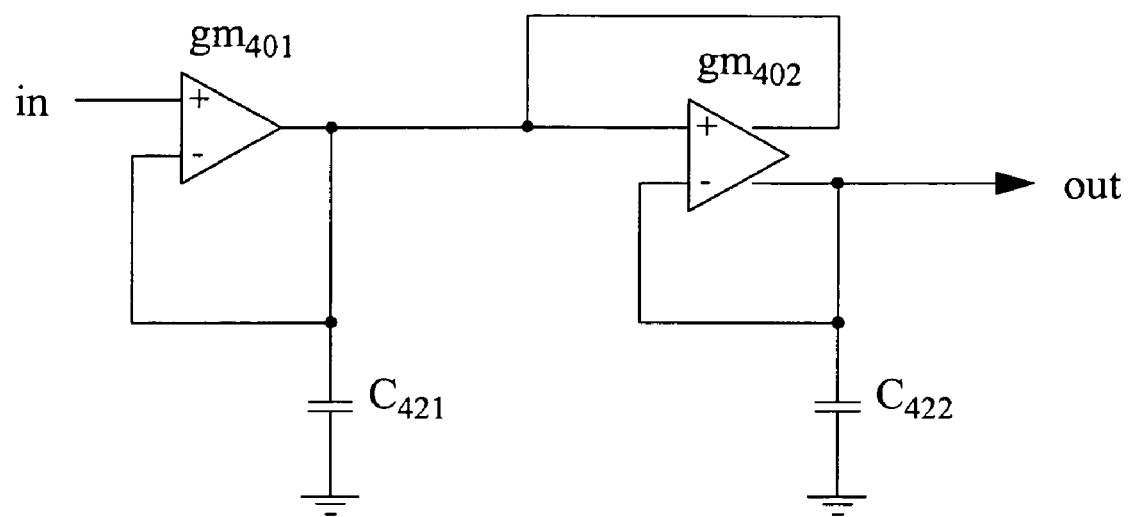
FIG. 4 is a small signal equivalent diagram of a second order gmC filter, according to one embodiment of the present invention.

FIG. 4 is a small signal equivalent diagram of a second order gmC filter, according to one embodiment of the present invention. Referring to FIG. 4, in one embodiment, an analog second order filter with a transfer function having complex poles may be implemented with a first transconductance amplifier $gm_{401}$, having a first capacitor load $C_{421}$, and a second transconductance amplifier $gm_{402}$ with two substantially equal current outputs and a second load capacitor $C_{422}$. Considering gm the common gain in the transconductance amplifiers $gm_{401}$ and $gm_{402}$, the transfer function of the circuit shown in FIG. 4 may be calculated as follows:

$$\frac{V_{out}}{V_{in}} = \frac{1}{1 + \frac{sC_{421}}{g_m} + \frac{s^2 C_{421} C_{422}}{g_m^2}} \quad (2)$$

Other transfer functions can be realized if the two outputs of the second transconductance amplifier are intentionally set at a ratio different than unity. However, as a condition of stability, the following relation needs to be preserved:

$$gm_{402} \leq gm_{401} \quad (3)$$

Figure 5:
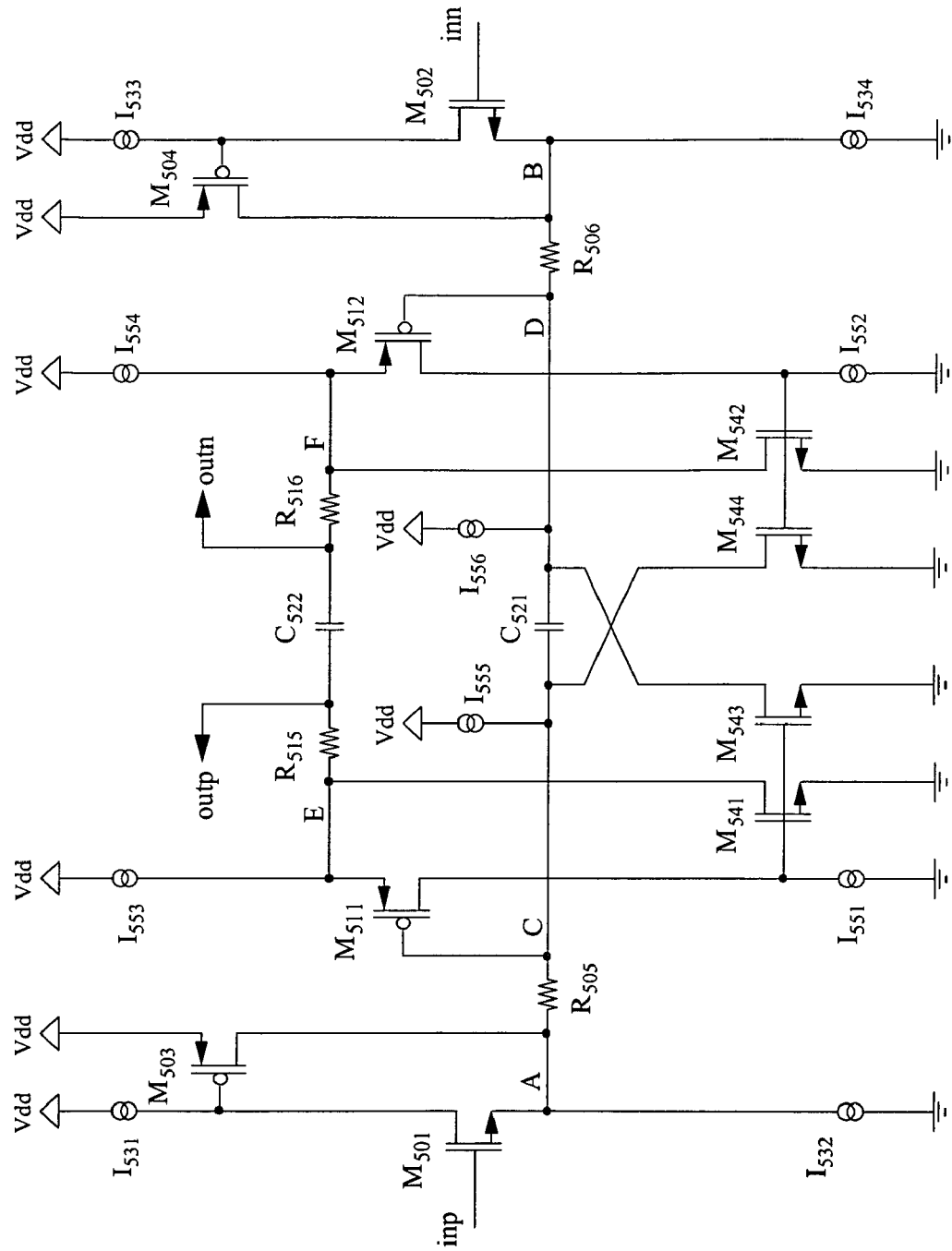
FIG. 5 is a schematic diagram of a second order gmC filter, according to one embodiment of the present invention.

From a practical implementation point of view, it is desirable to control the value of the transconductance gain and to maximize the signal linear range. One such implementation for a fully differential circuit is shown in FIG. 5. In one embodiment, the MOS devices $M_{501}$ and $M_{502}$ and the current sources $I_{531}$ and $I_{532}$ form a buffer with a very low impedance output. Since the current through the MOS device $M_{501}$ is forced to be substantially equal to $I_{531}$ current source by the feedback connection of $M_{503}$, the $M_{501}$ gate-to-source voltage is independent (to the first order, neglecting $M_{501}$ body effect and finite output impedance) of the input level and, therefore, the node A accurately follows the alternating current (AC) variations at the input node inp.

In one embodiment, the series resistor $R_{505}$ together with the input buffer just described form a very linear transconductor, with a transconductance gain determined by the resistor value $R_{505}$. Node C in FIG. 5 plays the role of the intermediate node in FIG. 4. Since the node A follows the input node voltage variation, the AC current injected into node C by the resistor $R_{505}$ is calculated as follows:

$$I_{505} = \frac{V_{inp} - V_C}{R_{505}} \quad (4)$$

The equivalence with the circuit in FIG. 4 is determined by the equation below:

$$gm_{401} = \frac{1}{R_{505}} \quad (5)$$

In one embodiment, a linear transconductance circuit is also implemented with MOS devices $M_{511}$, $M5_{541}$, and $M_{543}$, the current sources $I_{551}$, $I_{553}$ and $I_{555}$, and the resistor $R_{515}$. The local feedback connection with $M_{541}$ forces a constant current through $M_{511}$, determined by the current source $I_{511}$. Since the drain-to-source current through $M_{511}$ is largely independent of the voltage level at the C node, the level at node E will follow the AC variations at the node C. The current injected into the output node outp by the resistor $R_{515}$ is calculated as follows:

$$I_{515} = \frac{V_C - V_{outp}}{R_{515}} \quad (6)$$

The equivalence with the circuit in FIG. 4 is determined by the equation below:

$$gm_{402} = \frac{1}{R_{515}} \quad (7)$$

Moreover, since the $M_{511}$ current is constant, all the AC current in the resistor $R_{515}$ is supplied by $M_{541}$. In one embodiment, using a matched device $M_{543}$, a replica of the current through the $R_{515}$ is injected into the node D, which has the same function as node C in the fully differential circuit, but has opposite signal polarity. A similar analysis holds for the other side of this fully differential circuit.

In one embodiment, given the following matched devices:

$$M_{541} = M_{543};$$

$$M_{542} = M_{544};$$

$$R_{505} = R_{506} = R_{515} = R_{516} = R;$$

the overall transfer function of this circuit may be calculated with the equation below:

$$\frac{V_{out}}{V_{in}} = \frac{1}{1 + 2 \cdot s \cdot R \cdot C_{521} + 4 \cdot s^2 \cdot R^2 \cdot C_{521} \cdot C_{522}} \quad (8)$$

Although the parameters in the transfer function given by the equation (8) can be modified if a ratio different than 1 is used between $M_{541}/M_{542}$ and $M_{543}/M_{544}$ or the $R_{505}/R_{506}$ and $R_{515}/R_{516}$, for stability is important to follow the relation given by equation (3), which further translates into $$\frac{1}{R_{505}} \leq \frac{1}{R_{515}} \cdot \frac{gm_{542}}{gm_{541}} \quad (9)$$

and the equivalent for the other side of the differential circuit.

Figure 6:
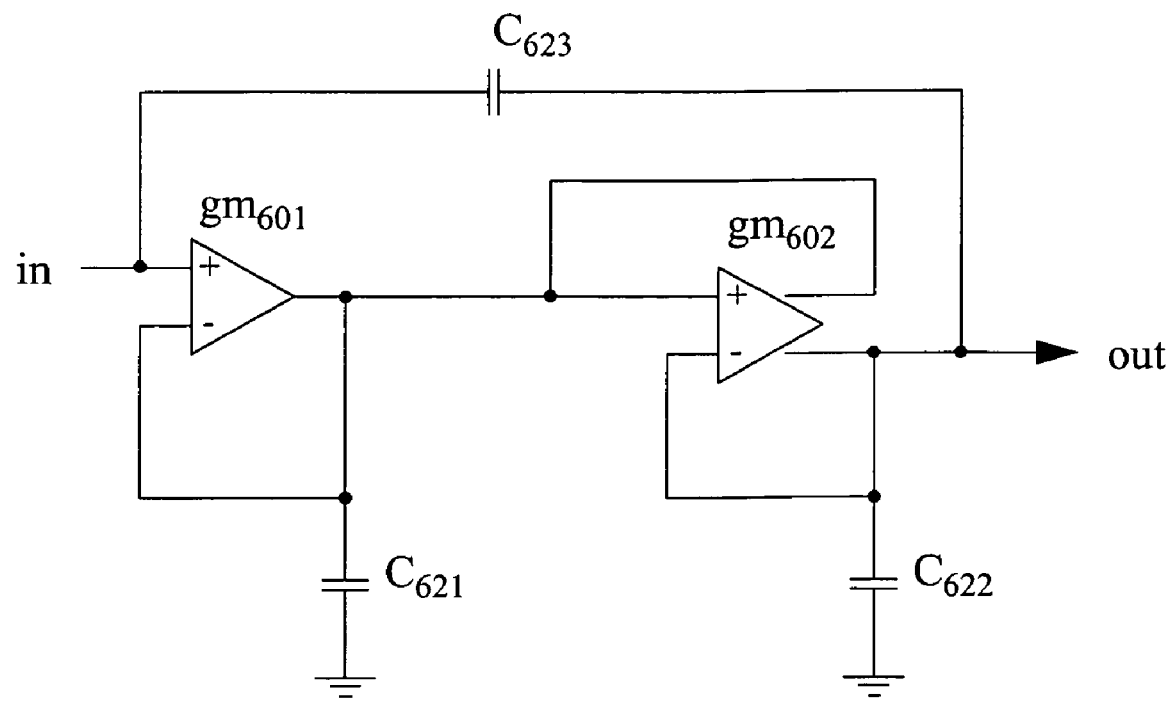
FIG. 6 is a small signal equivalent diagram of a second order gmC filter, according to an alternate embodiment of the present invention.

In another embodiment of the present invention, as illustrated in FIG. 6, transmission zeros may be implemented by using a feed-through capacitor $C_{623}$ between the input node and the output node. The transfer function $$\frac{V_{out}}{V_{in}} = \frac{1 + \frac{s^2 C_{621} C_{623}}{g_m^2}}{1 + \frac{sC_{621}}{g_m} + \frac{s^2 C_{621}(C_{622} + C_{623})}{g_m^2}} \quad (10)$$

has complex conjugate transmission zeros that may implement Chebyshev type II or elliptic filters.

Figure 7:
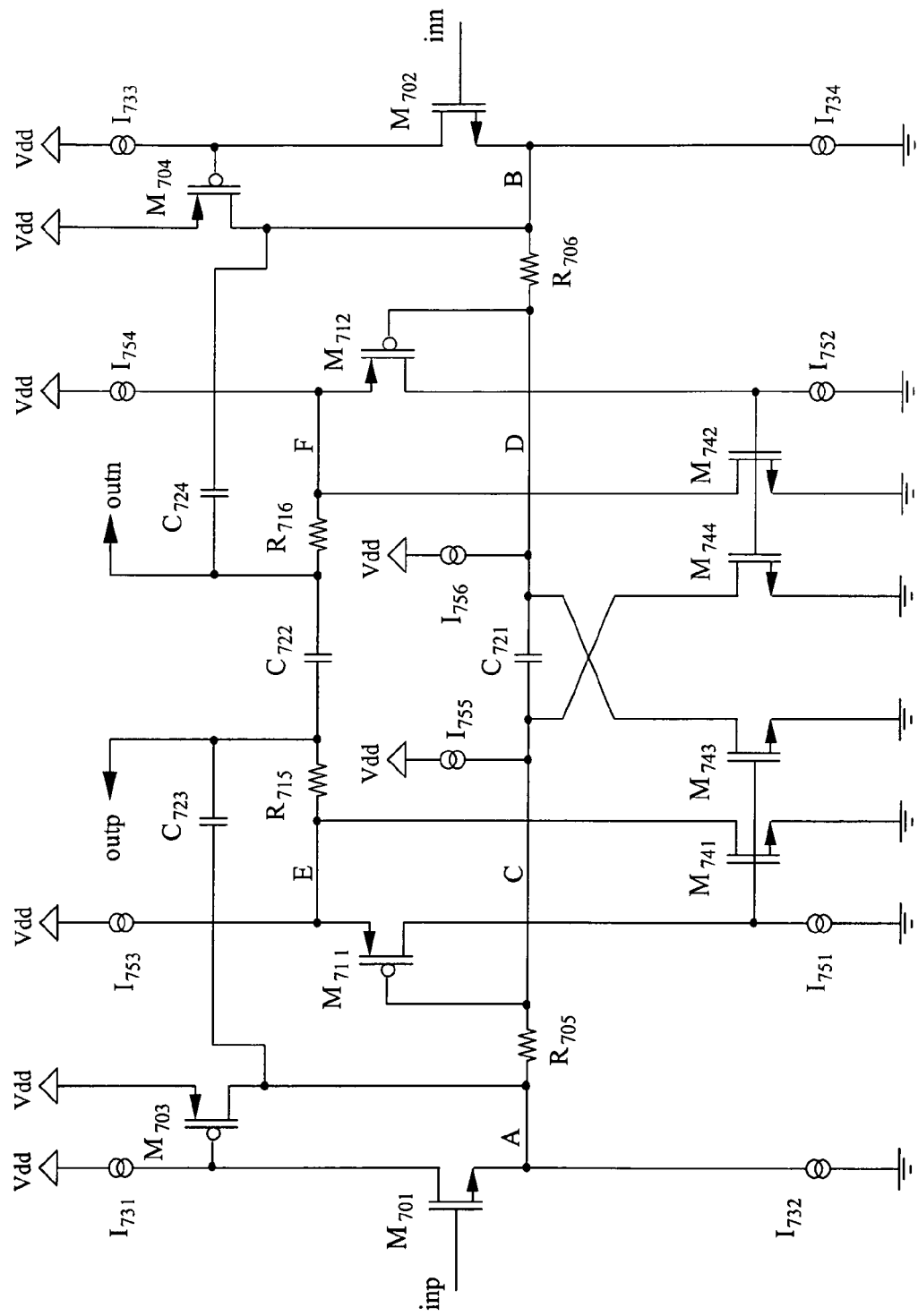
FIG. 7 is a schematic diagram of a second order gmC filter, according to an alternate embodiment of the present invention.

The transistor level implementation shown in FIG. 7 is equivalent to the circuit presented in FIG. 6. In one embodiment, the connection of transmission zeros capacitors $C_{723}$ and $C_{724}$ is actually taken from the outputs of the input buffers (nodes A and B) rather than the input nodes inp and inn, since the buffer output impedance is very low and controlled.

In one embodiment, given the following matched devices:

$M_{741}=M_{743}$;

$M_{742}=M_{744}$;

$R_{705}=R_{706}=R_{715}=R_{716}=R$;

$C_{723}=C_{724}$, the overall transfer function of this circuit may be calculated with the equation below:

$$\frac{V_{out}}{V_{in}} = \frac{1 + 2 \cdot s^2 \cdot R^2 \cdot C_{721} \cdot C_{723}}{1 + 2 \cdot s \cdot R \cdot C_{721} + 2 \cdot s^2 \cdot R^2 \cdot C_{721} \cdot (2 \cdot C_{722} + C_{723})} \quad (11)$$

Other transfer function implementations are possible by changing the connection of the feed-through capacitor. In one example, a real transmission zero may be implemented with the circuit shown in FIG. 8. In this embodiment, a feed-through capacitor $C_{823}$ is coupled between the input and the filter internal node. The transfer function $$\frac{V_{out}}{V_{in}} = \frac{1 + \frac{sC_{823}}{g_m}}{1 + \frac{s(C_{821} + C_{823})}{g_m} + \frac{s^2 C_{822}(C_{821} + C_{823})}{g_m^2}} \quad (12)$$

has a real transmission zero.

Figure 8:
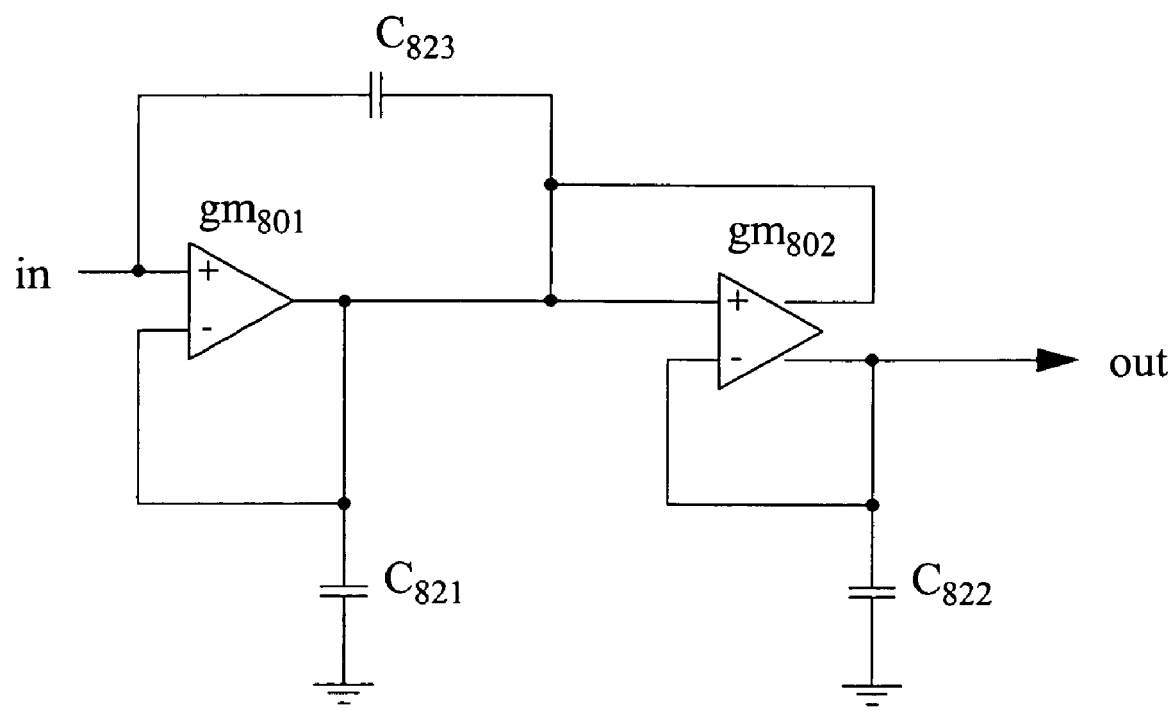
FIG. 8 is a small signal equivalent diagram of a second order gmC filter, according to yet another alternate embodiment of the present invention.
Figure 9:
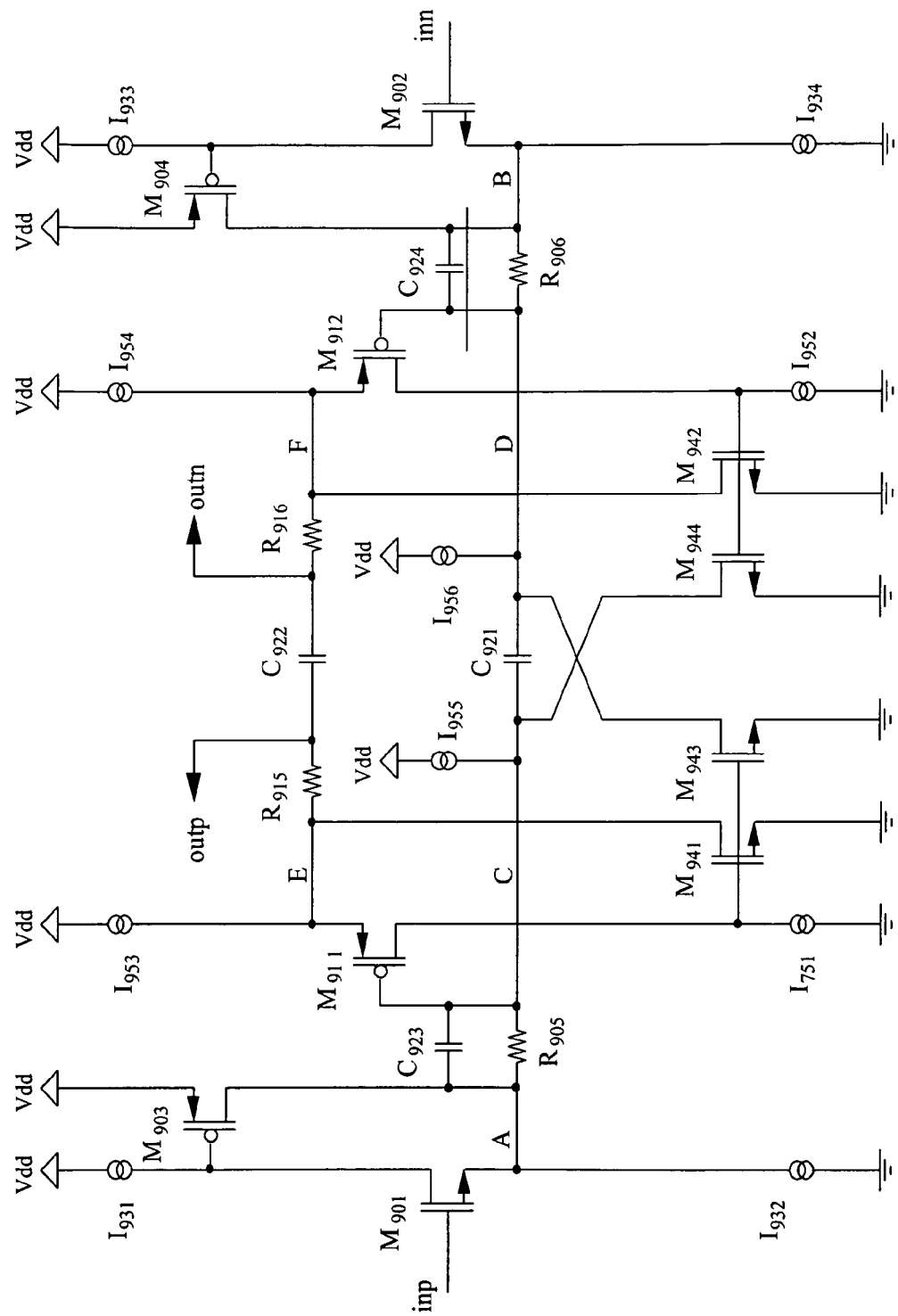
FIG. 9 is a schematic diagram of a second order gmC filter, according to yet another alternate embodiment of the present invention.

The transistor level implementation shown in FIG. 9 is equivalent to the circuit in FIG. 8. In one embodiment, the connection of transmission zeros capacitors $C_{923}$ and $C_{924}$ is actually taken from the outputs of the input buffers (nodes A and B) rather than the input nodes inp and inn, since the buffer output impedance is very low and controlled.

In one embodiment, given the following matched devices:

$M_{941}=M_{943}$;

$M_{942}=M_{944}$;

$R_{905}=R_{906}=R_{915}=R_{916}=R$;

$C_{923}=C_{924}$;

the overall transfer function of this circuit is calculated with the equation below:

$$\frac{V_{out}}{V_{in}} = \frac{1 + s \cdot R \cdot C_{923}}{1 + s \cdot R \cdot (2 \cdot C_{921} + C_{923}) + 2 \cdot s^2 \cdot R^2 \cdot C_{922} \cdot (2 \cdot C_{921} + C_{923})} \quad (13)$$

Figure 10:
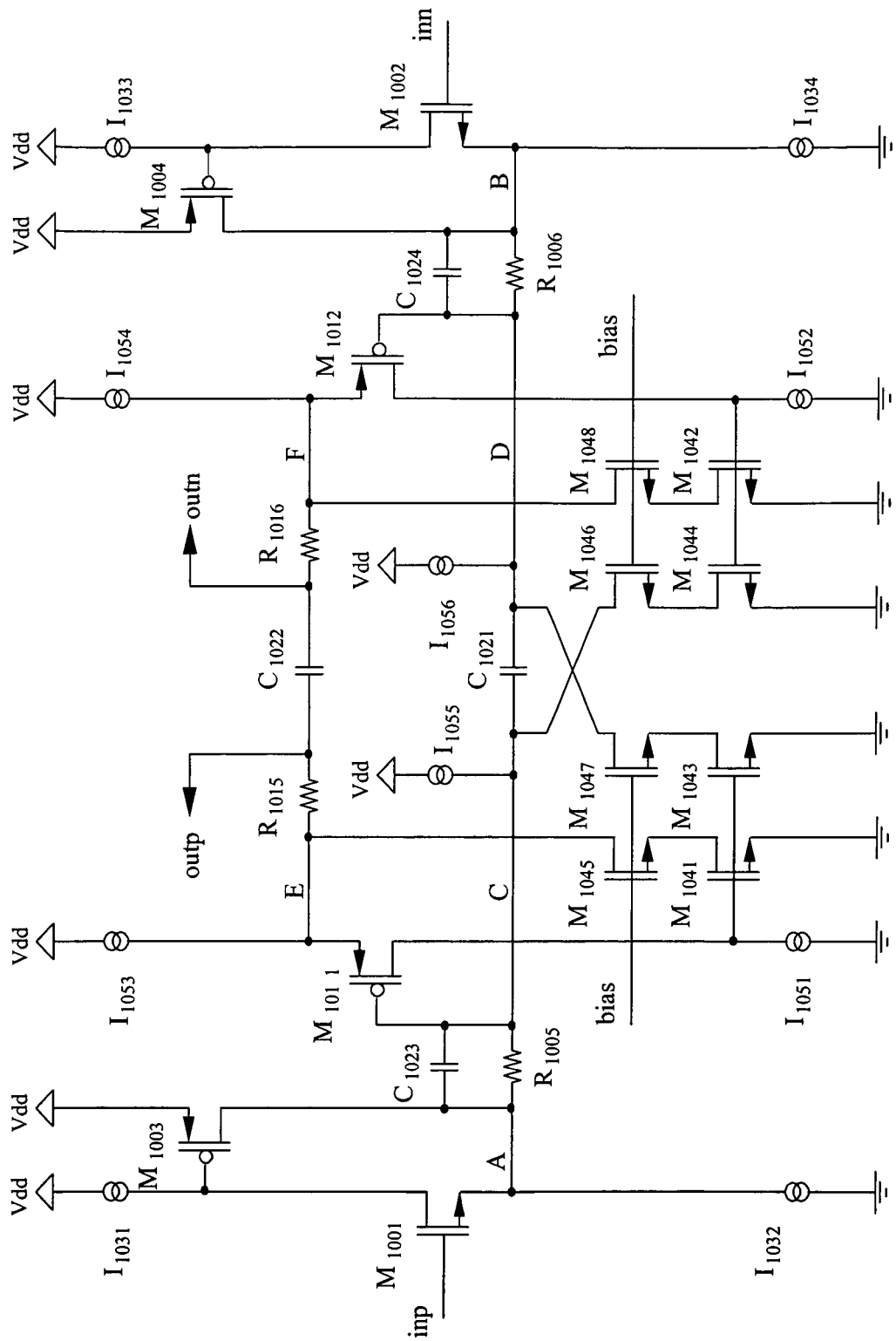
FIG. 10 is a schematic diagram of a second order gmC filter, according to yet another alternate embodiment of the present invention.

An enhanced version of the proposed circuit is shown in FIG. 10, where the transistors in the current mirror are cascoded to increase the output impedance and overall linearity.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In the foregoing description, the invention has been described with reference to specific exemplary embodiments thereof. It will, however, be evident that various modifications and changes be made thereto without departing from the broader spirit and scope of the invention as set forth in the appended claims. The specification and drawings are, accordingly, to be regarded in an illustrative sense rather than a restrictive sense.

The invention claimed is:

1. A second order analog filter comprising:
a filter input terminal;
a filter output terminal;
a filter internal node;
a filter reference terminal;
a first linear transconductance amplifier, having a first input terminal coupled to said filter input terminal, a second input terminal coupled to said filter internal node, and an output terminal coupled to said filter internal node;
a first capacitor coupled between said filter internal node and said filter reference terminal;
a second linear transconductance amplifier, having a first input terminal coupled to said filter internal node, a second input terminal coupled to said filter output terminal, a first output coupled to said filter output terminal, and a second output coupled to said filter internal node; and
a second capacitor coupled between said filter output node and said filter reference terminal.

2. The circuit according to claim 1, wherein said first and second linear transconductance amplifiers provide gains which are substantially based on resistance values for resistor devices connected to said first and second linear transconductance amplifiers.

3. The circuit according to claim 2, wherein at least one of said first linear transconductance amplifier and said second linear transconductance amplifier receive local feedback at the first input terminal of the linear transconductance particular amplifier from a point within the linear transconductance amplifier, the received local feedback used to improve output impedance and linearity.

4. The circuit of claim 3 wherein the first and second linear transconductance amplifiers are connected to transistors arranged in a cascoded fashion, the cascoded transistors configured to improve output impedance and linearity for the first and second linear transconductance amplifiers.

5. The circuit of claim 1 wherein the outputs of said second linear transconductance amplifier are connected to one or more current mirrors, the current mirrors configured to substantially match the second linear transconductance outputs.

6. A second order analog filter comprising:
a filter input terminal;
a filter output terminal;
a filter internal node;
a filter reference terminal;
a filter linear transconductance amplifier, having a first input terminal coupled to said filter input terminal, a second input terminal coupled to said filter internal node, and an output terminal coupled to said filter internal node;
a first capacitor coupled between said filter internal node and said filter reference terminal;
a second linear transconductance amplifier, having a first input terminal coupled to filter internal node, a second input terminal coupled to said filter output terminal, a first output coupled to said filter output terminal, and a second output coupled to said filter internal node;
a second capacitor coupled between said filter output terminal and said filter reference terminal; and
a third capacitor coupled between said filter input terminal and said filter output terminal.

7. The circuit of claim 6 wherein the first and second linear transconductance amplifiers provide gains which are substantially based on resistance values for resistors connected to said first and second linear transconductance amplifiers.

8. The circuit of claim 7 wherein at least one of said first linear transconductance amplifier and said second linear transconductance amplifier receive local feedback at the first input terminal of the linear transconductance particular amplifier from a point within the linear transconductance amplifier, the received local feedback used to improve output impedance and linearity.

9. The circuit of claim 8 wherein the first and second linear transconductance amplifiers are connected to transistors arranged in a cascoded fashion, the cascoded transistors configured to improve output impedance and linearity for the first and second linear transconductance amplifier.

10. The circuit of claim 6 wherein the outputs of said second linear transconductance amplifier are connected to one or more current mirrors, the current mirrors configured to substantially match the second linear transconductance outputs.

11. The second order analog filter comprising:
a filter input terminal;
a filter output terminal;
a filter internal node;
a filter reference terminal;
a first linear transconductance amplifier, having a first input terminal coupled to said filter input terminal, a second input terminal coupled to said filter internal node, and an output terminal coupled to said filter internal node;
a first capacitor coupled between said filter internal node and said filter reference terminal;
a second linear transconductance amplifier, having a first input terminal coupled to filter internal node, a second input terminal coupled to said filter output terminal, a first output coupled to said filter output terminal, and a second output coupled to said filter internal node;
a second capacitor coupled between said filter output terminal and said filter reference terminal;
a third capacitor coupled between said filter input terminal and said filter internal node.

12. The circuit of claim 11 wherein the first and second linear transconductance amplifiers provide gains which are substantially based on resistance values for resistors connected to said first and second linear transconductance amplifiers.

13. The circuit of claim 12 wherein at least one of said first linear transconductance amplifier and said second linear transconductance amplifier receive local feedback at the first input terminal of the linear transconductance particular amplifier from a point within the linear transconductance amplifier, the received local feedback used to improve output impedance and linearity.

14. The circuit of claim 13 wherein the first and second linear transconductance amplifiers are connected to transistors arranged in a cascoded fashion, the cascoded transistors configured to improve output impedance and linearity for the first and second linear transconductance amplifier.

15. The circuit of claim 11 wherein the outputs of said second linear transconductance amplifier are connected to one or more current mirrors, the current mirrors configured to substantially match the second linear transconductance outputs.

* * * * *